United States Patent
Maige

[11] Patent Number: 5,877,655
[45] Date of Patent: Mar. 2, 1999

[54] DEVICE FOR LIMITING THE OUTPUT CURRENT OF AN OPERATIONAL AMPLIFIER

[75] Inventor: Philippe Maige, Seyssinet-Pariset, France

[73] Assignee: SGS-Thomson Microelectronics S.A., Saint Genis, France

[21] Appl. No.: 744,233

[22] Filed: Nov. 5, 1996

[30] Foreign Application Priority Data

Nov. 14, 1995 [FR] France ..................... 95 13687

[51] Int. Cl.⁶ ........................................... H03F 3/45
[52] U.S. Cl. .................. 330/298; 330/207 P; 330/255
[58] Field of Search .............................. 330/207 P, 255, 330/298; 327/309, 323

[56] References Cited

U.S. PATENT DOCUMENTS

| | | | |
|---|---|---|---|
| 3,896,393 | 7/1975 | Cave et al. ............................. | 330/22 |
| 3,996,498 | 12/1976 | Schade, Jr. ........................... | 317/33 VR |
| 4,063,185 | 12/1977 | Kojima et al. ......................... | 330/255 |
| 4,199,797 | 4/1980 | Kusumi .................................. | 330/207 P X |
| 4,322,690 | 3/1982 | Laupman .............................. | 330/298 |
| 4,471,323 | 9/1984 | Trilling ................................... | 330/268 |
| 4,503,478 | 3/1985 | Seki et al. ............................. | 330/207 P X |
| 4,821,000 | 4/1989 | Imanishi ................................ | 330/298 |
| 5,384,549 | 1/1995 | Araki .................................... | 330/298 |

FOREIGN PATENT DOCUMENTS

A-0 269 845  6/1988  European Pat. Off. ......... A61N 1/08

OTHER PUBLICATIONS

French Search Report from French Patent Application No. 95 13687, filed Nov. 14, 1995.

*Primary Examiner*—Steven Mottola
*Attorney, Agent, or Firm*—Wolf, Greenfield & Sacks, P.C.

[57] ABSTRACT

A device for limiting the output current of an operational amplifier of the type including an output stage having an output transistor, including circuitry for limiting the biasing current of a differential input stage of the operational amplifier to a value determined by a measurement resistor connected between the output transistor and an output terminal of the operational amplifier.

38 Claims, 2 Drawing Sheets

DEVICE FOR LIMITING THE OUTPUT CURRENT OF AN OPERATIONAL AMPLIFIER

BACKGROUND OF THE INVENTION

1. Field of the Invention

The present invention relates to a device for limiting the negative output current of an operational amplifier. In other words, the invention relates to a current limiting device associated with a low-side half-stage of an output stage of the operational amplifier. The present invention applies more particularly to an operational amplifier having a differential input stage coupled to a low supply voltage (for example, a negative voltage or ground).

2. Discussion of the Related Art

FIG. 1 is a simplified diagram of an exemplary operational amplifier of the type to which the present invention applies.

The operational amplifier includes a differential input stage 1, a gain stage 2 and an output stage 3.

The differential input stage 1 is biased by a constant current source 4 and the gain stage 2 is biased by a constant current source 5. The output stage 3 is formed by two transistors T1 and T2 defining output high-side and low-side half-stages, respectively, each of which is associated with a respective device 6 and 7 for limiting the output current.

FIG. 1 represents an operational amplifier formed by bipolar transistors. Two diodes D1 and D2 are interposed between source 5 and the gain stage 2 to compensate for the base-emitter voltage drops of the bipolar transistors T1 and T2, of NPN and PNP-type respectively, of output stage 3.

The operational amplifier is supplied between a high voltage Vcc, for example a positive voltage, and a low voltage Vee, for example a negative voltage or ground. The operational amplifier includes two input terminals E– and E+ which are connected to the respective bases of two PNP transistors T3 and T4 of stage 1. The emitters of transistors T3 and T4 are connected to a first terminal of source 4, whose other terminal is connected to the supply line Vcc. The collector of each transistor T3 or T4 is connected to the collector of a respective NPN transistor T5 or T6, whose emitter can be connected, if necessary through a resistor (not shown), to the supply line Vee. The bases of transistors T5 and T6 are interconnected and transistor T5 is diode-connected, i.e., its base is connected to its collector. The collector of transistor T6 forms the output 8 of the differential input stage 1.

Output 8 is connected to the base of an NPN transistor T7 forming, for example, the gain stage 2. The emitter of transistor T7 is connected to line Vee. The collector of transistor T7 forms the output of stage 2. The output of stage 2 is provided to the respective bases of transistors T1 and T2. The collector of transistor T7 is directly connected to the base of transistor T2 which forms the low-side output half-stage of the operational amplifier. The collector of transistor T7 is also connected, through two series diodes D1 and D2, to the base of transistor T1 forming the high-side output half-stage. Transistor T7 is biased by source 5 having a first terminal connected to line Vcc and a second terminal connected, through diodes D1 and D2, to the collector of transistor T7.

The collector of transistor T7 is connected to line Vcc and its emitter is connected, through a resistor R1 of a device for limiting the output current 6, to an output terminal S of the operational amplifier. The collector of transistor T2 is connected to line Vee and its emitter is connected, through a resistor R of a device for limiting the input current 7, to the output terminal S. Resistors R1 and R2 form resistors for measuring the positive and negative currents, respectively, of the output stage 3.

Device 6 is formed by resistor R1 and an NPN transistor T8. The base of transistor T8 is connected to the emitter of transistor T1 and its emitter is connected to terminal S. The collector of transistor T8 is connected to the base of transistor T1.

Device 7 is formed by resistor R2 and a PNP transistor T9. The base of transistor T9 is connected to the emitter of transistor T2 and its emitter is connected to terminal S. The collector of transistor T9 is connected to the bases of transistors T5 and T6 of the differential input stage 1.

The normal operation of an operational amplifier such as represented is FIG. 1 is well known by those skilled in the art and will not be described.

The role of the current limiting devices 6 and 7 is to protect the operational amplifier during its critical operation, i.e., when the output (positive or negative) current of the operational amplifier exceeds the values for which the operational amplifier is designed, risking to damage the operational amplifier. Such a critical operation condition may occur, for example, if the impedance of the load connected to terminal S is too low or in case of accidental short-circuit at the output of the operational amplifier.

When the positive output current of the operational amplifier exceeds a value predetermined by the size of resistor R1, transistor T8 becomes conductive, which causes the base current of transistor T1 to decrease, thereby limiting the positive output current of the operational amplifier. The limit value of the current corresponds to the ratio of the base-emitter junction voltage $Vbe_{ON}$ of transistor T8 in the conductive state and resistance R1. Under normal operation conditions, i.e., when the current flowing through resistor R1 is lower than $Vbe_{ON}/R1$, the base-emitter voltage of transistor T8 is too low and transistor T8 is not conductive.

When the negative output current of the operational amplifier is such that the voltage drop across resistor R2 exceeds the base-emitter voltage $Vbe_{ON}$ of transistor T9 in the conductive state, transistor T9 becomes conductive, which causes the base current of transistor T6 of the input stage 1 to increase. The resulting increased collector current of transistor T6 causes the base current of transistor T7 to decrease and, thus, the base current of transistor T2 to decrease. As for device 6, the current limitation is determined by the value of resistor R2 and is equal to the ratio of the base-emitter voltage $Vbe_{ON}$ of transistor T9 in the conductive state and resistance R2. Under normal operation conditions, i.e., when the current flowing through the measurement resistor R2 is lower than $Vbe_{ON}/R2$, transistor T9 is not conductive.

A drawback of a conventional operational amplifier such as represented in FIG. 1 is that the negative current limited by device 7 causes oscillations of the output current of the operational amplifier. The limitation current loop, formed by transistor T9 and transistors T6 and T7, is not stable because of the limited bandwidth of PNP transistor T9. This problem does not occur for device 6 since the current limitation loop is formed by an NPN transistor T8 inherently having a wide bandwidth.

Such oscillations are undesirable, especially because they pollute the positive supply line Vcc. For example, if a short-circuit occurs between the output terminal S and the supply voltage Vcc, the oscillations resulting from the current limited by device 7 are reproduced on the supply line Vcc, which may impair the proper operation of other circuits supplied by the supply line Vcc.

Using a PNP transistor for transistor T9 is correlated to the connection of the measurement resistor R2 to the emitter of transistor T2. The conventional device more particularly applies to an operational amplifier whose low-side output half-stage is formed by a so-called vertical transistor, for example, a PNP bipolar transistor whose collector corresponds to the substrate, which makes it necessary to connect the measurement resistor R2 to the emitter of transistor T2.

A further drawback is that the action of device 7 on the differential input stage 1 is asymmetric, regardless of whether transistor T2 is vertical or lateral, which creates an offset in the biasing of input transistors T3 and T4 of the operational amplifier. The conventional limitation of the negative output current causes a current to be injected in the bases of transistors T5 and T6, and thus in the collector of transistor T5 only.

SUMMARY OF THE INVENTION

An object of the present invention is to avoid the drawbacks of the conventional output current limiting devices by providing a current limiting device which prevents the output current from oscillating during the current limitation periods.

A further object of the present invention is to provide such a limiting device which has a very simple structure and does not generate an offset in the biasing of the differential inputs of the operational amplifier.

To achieve these objects, the present invention provides a device for limiting the output current of an operational amplifier of the type including an output stage provided with an output transistor, which comprises means for limiting the biasing current of a differential input stage of the operational amplifier to a value determined by a measurement resistor connected between the output transistor and an output terminal of the operational amplifier.

According to an embodiment of the invention, the device includes a transistor for measuring the current flowing through the measurement resistor, the measurement transistor controlling a biasing source of the differential input stage.

According to an embodiment of the present invention, the output transistor is a bipolar transistor of PNP-type having its emitter connected to the emitter of the measurement transistor.

According to an embodiment of the present invention, the measurement transistor is an NPN bipolar transistor having its base connected to the output terminal and its collector connected to the emitter of a PNP bipolar transistor which forms the biasing source, the emitter of the biasing transistor being connected to a high supply line through a resistor.

According to an embodiment of the present invention, the value of the resistor of the biasing source is selected so that the measurement transistor very slightly saturates only in the case of a short-circuit between the output terminal and the high supply line.

According to an embodiment of the present invention, the output transistor is a vertical transistor.

The invention also provides an operational amplifier including a differential input stage referenced to a low supply line and biased from a high supply line by a biasing source, an output stage having at least one output transistor connected to the low supply line and a device for limiting the negative output current of the operational amplifier, the limiting device including means for limiting the biasing current of the differential input stage.

According to an embodiment of the present invention, the amplifier is fabricated in bipolar technology, the output transistor being formed by a PNP transistor and the device for limiting the current is formed by an NPN transistor measuring the current flowing through a measurement resistor connected between the emitter of the output transistor and an output terminal of the operational amplifier, the collector of the measurement transistor being connected to the emitter of a PNP transistor of the biasing source.

According to an embodiment of the present invention, the biasing source is formed by a resistor having a first terminal connected to the high supply line and a second terminal connected to the emitter of the biasing transistor that is mirror-connected to a PNP transistor whose collector is connected to the low supply line through a constant current source.

According to an embodiment of the present invention, the output transistor is a vertical transistor.

The foregoing and other objects, features, aspects and advantages of the invention will become apparent from the following detailed description of the present invention when taken in conjunction with the accompanying drawings.

BRIEF DESCRIPTION OF THE DRAWINGS

For the sake of clarity the same elements are designated with the same references in the various figures. Similarly, only the elements of an operational amplifier which are necessary to understand the invention are shown in the figures.

DETAILED DESCRIPTION

Figure 2:
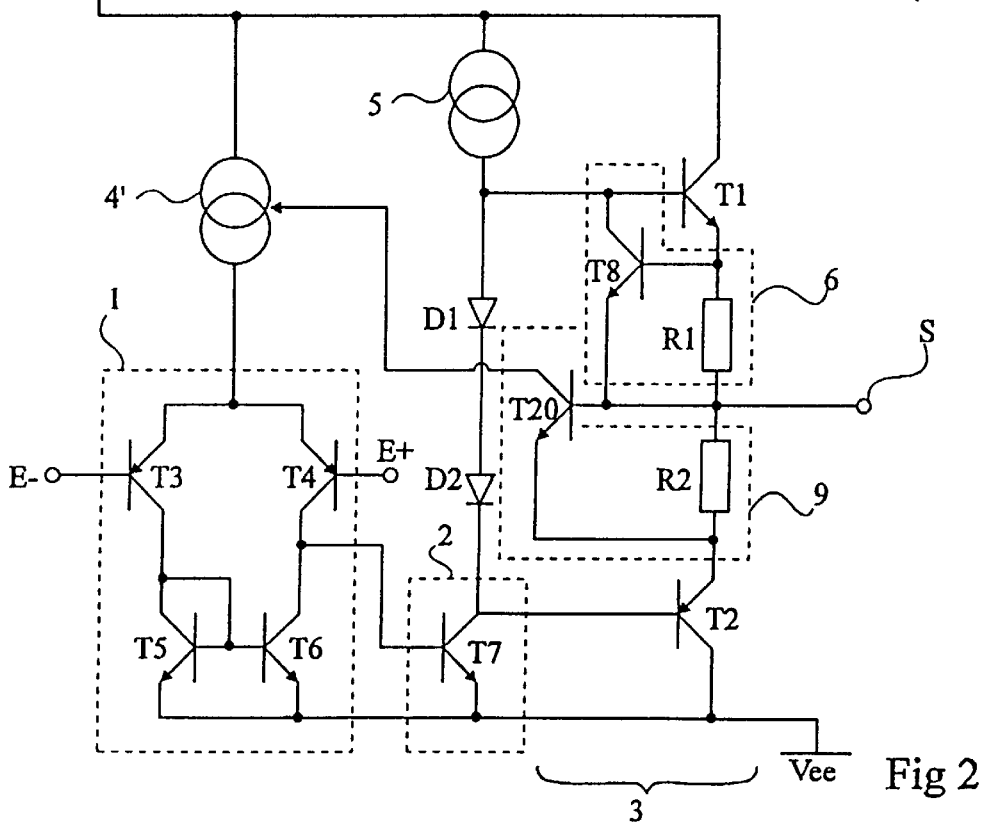
FIG. 2 is a simplified diagram of an embodiment of an operational amplifier provided with a device for limiting the current according to the invention.

FIG. 2 is a simplified diagram of an embodiment of an operational amplifier provided with a device for limiting the current of the low-side output half-stage of the operational amplifier according to the invention.

Figure 1:
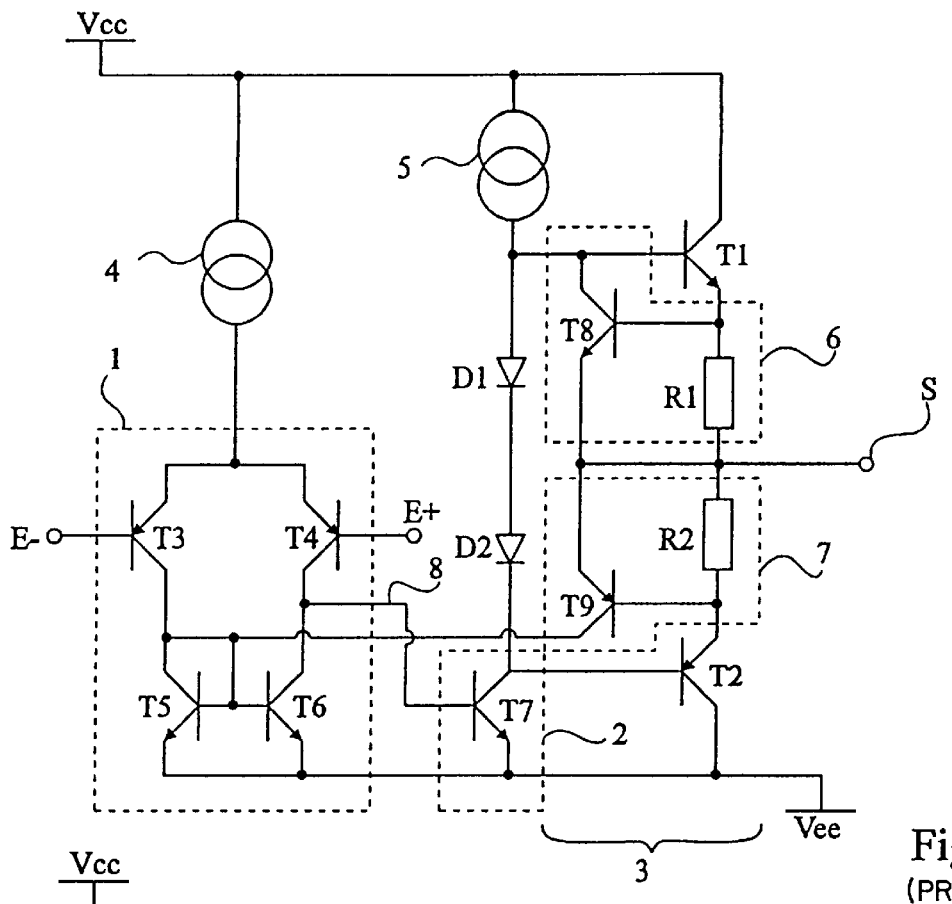
FIG. 1 is a diagram of a conventional operational amplifier.

The operational amplifier includes, as above, a differential input stage 1 referenced to a low supply voltage Vee, for example a negative voltage or ground. Stage 1 is, for example, as in FIG. 1, formed by transistors T3, T4, T5 and T6. The operational amplifier also includes a gain stage 2 formed, for example, by an NPN transistor T7 biased through a source 5 with interposition of diodes D1 and D2 to compensate for the base-emitter voltages of the output transistors. The output stage 3 includes, as above, an NPN transistor T1 and a PNP transistor T2, which define high-side and low-side half-stages, respectively, of the output stage. Transistor T1 is associated with a positive current limiting device 6 which operates like the device described with relation to FIG. 1. Transistor T2, which may be vertical, is associated with a negative current limiting device 9 according to the invention.

A distinctive feature of the present invention is that device 9, which is associated with the PNP transistor T2, is formed by an NPN transistor T20 associated with a measurement resistor R2.

Resistor R2 is still connected between an output terminal S of the operational amplifier and the emitter of transistor T2. The base of transistor T20 is connected to terminal S whereas its emitter is connected to the emitter of transistor T2.

A further distinctive feature of the present invention is that the device 9 for limiting the incoming current no longer injects a current in the bases of the low-side transistors T5 and T6 of the differential input stage 1, but modifies the current provided by a biasing source 4' of stage 1. Thus, device 9 directly acts on source 4' which, in addition to allowing the use of an NPN transistor as a measurement transistor, makes the effects of the current limitation symmetrical on the two inputs E– and E+ of the operational amplifier.

When the current flowing through resistor R2 exceeds a limit value, which is determined by the value of resistor R2, transistor T20 becomes conductive and causes a decrease of the current provided to stage 1 by source 4'. The decreased biasing of stage 1 causes a symmetrical decrease in the collector and base currents of transistors T5 and T6, thereby decreasing the base current of transistor T7. Thus, the base current of transistor T2 of the low-side output half-stage also decreases, which causes the current through resistor R2 to decrease.

Thus, in a critical operation condition, the value of the negative output current is servo-controlled to a limit value determined by the ratio of the base-emitter voltage $Vbe_{ON}$ of transistor T20 in the conductive state and resistance R2.

The normal operation of the operational amplifier is not modified. When the current flowing through resistor R2 is lower than the limit value $Vbe_{ON}/R2$, transistor T20 is not conductive and the current is not limited. The effect of the leak collector current of transistor T20 on the biasing of stage 1 is negligible.

An advantage of the present invention is that the limitation loop of the negative output current of the operational amplifier is stable because of the use of an NPN transistor which has a very wide bandwidth, which eliminates oscillations of the output current during the critical operation conditions.

A further advantage of the present invention is that the current limitation, under critical operation condition, does not generate any offset in the biasing of the differential inputs of the operational amplifier, regardless of whether transistor T2 is vertical or lateral.

Figure 3:
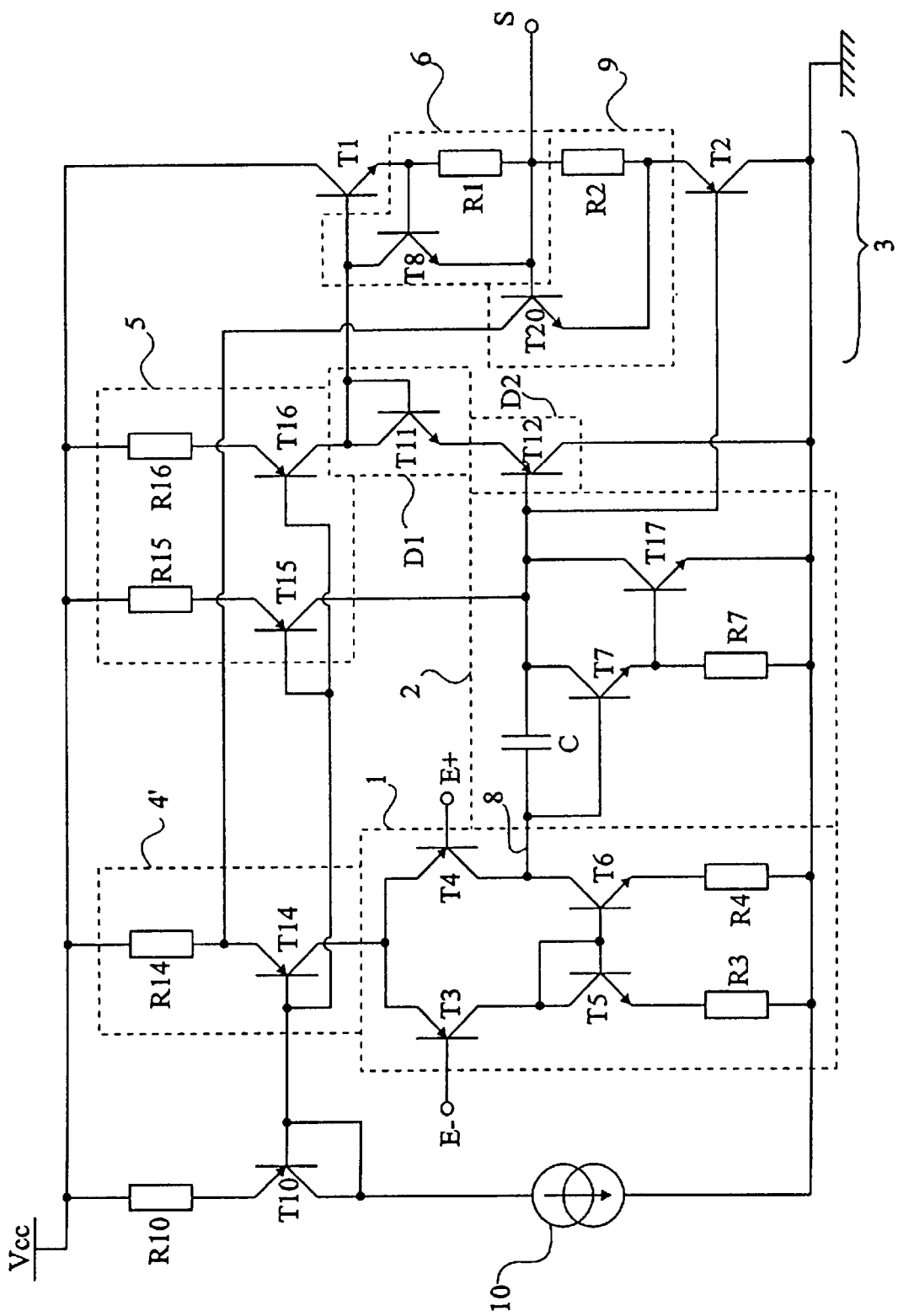
FIG. 3 is a detailed diagram of the operational amplifier represented in FIG. 2, illustrating an embodiment of a biasing source designed to cooperate with the current limiting device according to the invention.

FIG. 3 illustrates an embodiment of the biasing sources of an operational amplifier according the present invention. It is assumed, for example, that the negative supply line is ground, in this case.

The emitters of transistors T5 and T6 are connected to ground through resistors R3 and R4, respectively. The differential stage 1, as represented in FIG. 3, forms a conventional input stage of an operational amplifier. It should be remarked that stage 1 may be fabricated in a different way. For example, transistors T3 and T4 can be replaced with Darlington circuits each of which is formed by a plurality of bipolar transistors or by a composite combination of PNP and NPN transistors.

The exemplary gain stage 2 shown in FIG. 3 is formed by a Darlington connection of two NPN transistors T7 and T17. Output 8 of stage 1 is connected to the base of a first transistor T7 having its emitter connected to ground through a resistor R7 and to the base of a second transistor T17. The emitter of transistor T17 is connected to ground and the collectors of transistors T7 and T17 are connected, through a capacitor C, to an output 8 of stage 1. Capacitor C forms a conventional compensation capacitor of a gain stage of an operational amplifier. Capacitor C is used under normal operation conditions to decrease the bandwidth of the amplifier to make the operational amplifier stable at unity gain. The collectors of transistors T7 and T17 form the output of stage 2, which is directly provided to the base of the low-side output transistor T2 and, through diodes D2 and D1, to the base of the high-side output transistor T1. It should be remarked that stage 2 may have a different structure, for example, it can include a plurality of Darlington circuits.

Diodes D1 and D2 are, for example, formed by an NPN transistor T11 and a PNP transistor T12, respectively. The collectors of transistors T7 and T17 are connected to the base of the PNP transistor T12 forming diode D2 and whose collector is connected to ground. The emitter of transistor T12 is connected to the emitter of NPN transistor T11 forming diode D1 and whose base and collector are connected to the base of transistor T1.

The operational amplifier, such as represented in FIG. 3, is biased by a single constant current generator 10 whose current is mirrored by current mirrors 4' and 5 to bias the different stages of the amplifier.

Source 10 is connected between ground, or a low supply line, for example negative, and the collector of a PNP transistor T10 whose emitter is connected, preferably through a resistor R10, to line Vcc. The PNP transistors which respectively form biasing sources 4' and 5 are current mirror-connected to transistor T10 and their bases are connected to the base of transistor T10. Source 4' is formed by a transistor T14 having its collector connected to the emitters of transistors T3 and T4 and its emitter connected to line Vcc through a resistor R14. Source 5 is formed by two transistors T15 and T16 which are current mirror-connected to transistor T10 and whose emitters are connected to line Vcc, preferably through respective resistors R15 and R16. The collector of transistor T15 is connected to the collectors of transistors T7 and T17 and the collector of transistor T16 is connected to the collector of transistor T11.

The collector of transistor T20 is connected to the emitter of the biasing transistor T14 of stage 1. Thus, when transistor T20 is conductive, the base-emitter voltage of transistor T14 decreases due to the fact that the base of transistor T14 is connected to a constant voltage. The collector current of transistor T14, therefore the biasing current of stage 1, decreases.

It should be remarked that the present invention is particularly well adapted to an operational amplifier whose biasing sources are realized from a single constant current source providing a plurality of different currents using current mirrors formed by transistor and resistor combinations.

In the case where the biasing sources do not include a resistor, a resistor is added between the emitter of the biasing transistor of stage 1 and line Vcc to implement the invention.

To ensure protection of the operational amplifier in case of a short-circuit between terminal S and line Vcc, resistor R14 is, according to the invention, sized to cause a voltage drop lower than approximately 200 mV in this case. Indeed, if the voltage drop across resistor R14 is too high, for example approximately 500 mV, transistor T20 saturates and the servo-control of the current to the limit value, determined by the ratio of the base-emitter voltage in the conductive state of transistor T20 and resistance R2, can no longer be achieved. In contrast, if transistor T20 slightly saturates, i.e., if the voltage difference between its base and its collector is lower than approximately 200 mV, the servo-control is maintained.

It should also be remarked that capacitor C of gain stage 2 contributes, in critical operation conditions, to stabilize the current limitation loop according to the invention. The use of the NPN transistor T20, in contrast to the conventional connection using the PNP transistor T9 (FIG. 1), generates a dominating cut-off frequency, determined by capacitor C, in the control loop which ensures a very stable control.

The sizes of the various components of the operational amplifier according to the invention depend upon the desired characteristics of the operational amplifier. In particular, the polarities of the various current mirror-connected transistors and the values of the resistances which may be possibly associated therewith depend on the desired biasing currents for the differential input stage 1 and the gain stage 2.

As is apparent to those skilled in the art, various modifications can be made to the above preferred embodiments. More particularly, although the above description referred to an operational amplifier formed by bipolar transistors, the operational amplifier according to the invention can also be fabricated in MOS technology. For this purpose, the NPN transistors are replaced with N-channel MOS transistors and the PNP transistors are replaced with P-channel MOS transistors. In addition, the invention also applies to an operational amplifier whose low-side output transistor T2 is a lateral transistor having its emitter connected to terminal S through a resistor R2.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A device for limiting a magnitude of the output current of an operational amplifier including an output stage having an output transistor, comprising means for limiting the biasing current of a differential input stage of the operational amplifier to a value determined by a measurement resistor connected between said output transistor and an output terminal of the operational amplifier;

wherein the magnitude of the output current is limited to a non-zero value.

2. The device of claim 1, including a transistor for measuring the current flowing through said measurement resistor, said measurement transistor controlling a biasing source of said differential input stage.

3. The device of claim 2, wherein said output transistor is a bipolar transistor of PNP-type having an emitter connected to an emitter of said measurement transistor.

4. The device of claim 2, wherein said measurement transistor is an NPN bipolar transistor having a base connected to said output terminal and a collector connected to the emitter of a PNP bipolar transistor constituting the biasing source, and emitter of said biasing transistor being connected to a high supply line through a resistor.

5. The device of claim 4, wherein a value of said resistor of the biasing source is selected so that said measurement transistor only very slightly saturates in case of a short-circuit between said output terminal and the high supply line.

6. The device of claim 5, wherein said output transistor is a vertical transistor.

7. An operational amplifier including a differential input stage referenced to a low supply line and biased from a high supply line by a biasing source, an output stage having at least one output transistor connected to the low supply line and a device for limiting the negative output current of the operational amplifier to a first non-zero value, wherein said limiting device includes means for limiting the biasing current of said differential input stage to a second non-zero value.

8. The operational amplifier of claim 7, fabricated in bipolar technology, said output transistor being formed by a PNP transistor and said device for limiting the current is formed by an NPN transistor measuring the current flowing through a measurement resistor connected between the emitter of said output transistor and an output terminal of the operational amplifier, the collector of said measurement transistor being connected to the emitter of a PNP transistor of said biasing source.

9. The operational amplifier of claim 8, wherein said biasing source is formed by a resistor having a first terminal connected to the high supply line and a second terminal connected to the emitter of said biasing transistor that is mirror-connected to a PNP transistor whose collector is connected to the low supply line through a constant current source.

10. The operational amplifier of claim 7, wherein said output transistor is a vertical transistor.

11. The device of claim 3 wherein said measurement transistor is an NPN bipolar transistor having its base connected to said output terminal and its collector connected to the emitter of a PNP bipolar transistor constituting the biasing source, the emitter of said PNP bipolar transistor being connected to a high supply line through a resistor.

12. The device of claim 11, wherein the value of said resistor of the biasing source is selected so that said measurement transistor only very slightly saturates in case of a short-circuit between said output terminal and the high supply line.

13. A circuit comprising:

a differential input stage coupled to a first power supply through a biasing source:

an output stage comprising means for controlling said biasing source:

wherein said output stage comprises a first transistor having a first terminal coupled to a second power supply and a second terminal coupled to an output terminal;

wherein said controlling means comprises:
a second transistor having a first terminal coupled to said biasing source, a second terminal coupled to said second terminal of said first transistor and a third terminal coupled to said output terminal; and
a first resistor coupled between said output terminal and said second terminal of said first transistor; and wherein said biasing source comprises a third transistor having a first terminal coupled to said differential input stage and a second terminal coupled to said first terminal of said second transistor and to said first power supply through a second resistor.

14. The circuit of claim 13 further comprising a gain stage coupled between said differential input stage and a third terminal of said first transistor.

15. The circuit of claim 14 wherein said gain stage comprises fourth and fifth transistors, said fourth transistor having a first terminal coupled to a first terminal of said fifth transistor, to said third terminal of said first transistor, to a third terminal of said fourth transistor and to said differential input stage and a second terminal coupled to said second power supply; and said fifth transistor having a second terminal coupled to said second power supply and a third terminal coupled to said second terminal of said fourth transistor.

16. The circuit of claim 13 further comprising a fourth transistor having a first terminal coupled to said second power supply through a constant current source, a second terminal coupled to said first power supply through a third resistor and a third terminal coupled to said first terminal of said fourth transistor and to a third terminal of said third transistor.

17. The circuit of claim 16 wherein when current flowing through said first resistor exceeds a limit value, said second transistor operates to modify current provided to said differential input stage by said biasing source.

18. The circuit of claim 17 wherein said limit value is determined by the value of said first resistor.

19. The circuit of claim 17 wherein said current modification symmetrically affects inputs of said differential input stage.

20. A circuit comprising:
a differential input stage coupled to a first power supply through a biasing source;
an output stage comprising means for controlling said biasing source;
wherein said output stage further comprising a series coupling of a first transistor, a first resistor, a second resistor and a second transistor, said output stage comprising an output terminal at a coupling point of said first and second resistors; and
wherein said controlling means comprising a third transistor coupled between said biasing source, said output terminal and said second transistor.

21. The circuit of claim 19 wherein said first, third and fourth transistors are PNP bipolar transistors and said second transistor is a NPN bipolar transistor and wherein in each transistor, said first terminal is a collector of the transistor, said second terminal is an emitter of the transistor and said third terminal is a base of the transistor.

22. A circuit comprising:
a differential input stage coupled to a first power supply through a biasing source;
an output stage comprising means for controlling said biasing source;
wherein said output stage comprises a first transistor having a first terminal coupled to a second power supply and a second terminal coupled to an output terminal;
wherein said controlling means comprises:
a second transistor having a first terminal coupled to said biasing source, a second terminal coupled to said second terminal of said first transistor and a third terminal coupled to said output terminal;
a first resistor coupled between said output terminal and said second terminal of said first transistor; and
wherein said output stage further comprises a current limiting device coupled between a third transistor and said controlling means, said third transistor having first, second, and third terminals, said first terminal being coupled to said first power supply.

23. The circuit of claim 22 wherein said current limiting device comprises a fourth transistor having a first terminal coupled to said third terminal of said third transistor, a second terminal coupled to said third terminal of said second transistor and to said output terminal, a third terminal coupled to said second terminal of said third transistor; and
a second resistor coupled between said third terminal of said fourth transistor and said output terminal.

24. The circuit of claim 23 wherein said first, second, third and fourth transistors are implemented in bipolar technology.

25. An operational amplifier comprising:
differential input means for receiving an input signal;
biasing means for providing a current to said differential input means;
output means for providing an output of said operational amplifier; and
means for limiting said output to a non-zero value by manipulating said biasing means.

26. The operational amplifier of claim 25 wherein said biasing means comprises a first transistor coupled between a first power supply and said differential input means.

27. The operational amplifier of claim 25 wherein said limiting means comprises a second transistor having a first terminal coupled to said first transistor and a second terminal coupled to an output terminal of said operational amplifier; and
a resistor coupled between said output terminal and a third terminal of said second transistor.

28. The operational amplifier of claim 27 wherein when current flowing through said resistor exceeds a limit value, said second transistor operates to modify current supplied to said differential input means by said biasing means.

29. The operational amplifier of claim 28 wherein said limit value is determined by the value of said resistor.

30. A method of limiting the magnitude of an output current of an operational amplifier to a first non-zero value, the method comprising:
obtaining a measurement of said output current; and
limiting the magnitude of a biasing current of an input stage of said operational amplifier to a second non-zero value, said limiting being based on said measurement of said output current.

31. The method of claim 30, wherein said obtaining step comprises measuring a voltage drop across a resistor coupled to an output terminal of said operational amplifier.

32. The method of claim 31, wherein said limiting step comprises decreasing current which flows through a transistor which provides said biasing current.

33. The method of claim 32, wherein said decreasing step comprises reducing a base-emitter voltage of said transistor.

34. The device of claim 1, wherein the non-zero value is a maximum value.

35. The operational amplifier of claim 25, wherein the non-zero value is a maximum value.

36. The method of claim 30, wherein the first non-zero value is a maximum value.

37. The method of claim 30, wherein the second non-zero value is a maximum value.

38. A method of servo controlling an output current of an operational amplifier, the method comprising:
obtaining a measurement of the output current;
limiting the magnitude of a biasing current of an input stage of the operational amplifier in response to the measurement of the output current; and
maintaining the operational amplifier in an active mode of operation.

* * * * *

UNITED STATES PATENT AND TRADEMARK OFFICE
CERTIFICATE OF CORRECTION

PATENT NO. : 5,877,655
DATED : March 2, 1999
INVENTOR(S) : Philippe Maige

It is certified that error appears in the above-identified patent and that said Letters Patent is hereby corrected as shown below:

Col. 1, line 64, should read "The collector of transistor T1 is connected to line Vcc and"

Col. 2, line 2, should read "resistor R2 of a device for limiting the input current 7, to the"

Col. 5, line 34, should read "leakage collector current of transistor T20 on the biasing of"

Signed and Sealed this

Fifteenth Day of June, 1999

Attest:

Q. TODD DICKINSON

*Attesting Officer*   Acting Commissioner of Patents and Trademarks